United States Patent [19]

Ipcinski

[11] Patent Number: 5,216,316
[45] Date of Patent: Jun. 1, 1993

[54] PIEZO ELECTRIC TRANSDUCER

[76] Inventor: Ralph Ipcinski, 295 Silver Lake Rd., Hollis, N.H. 03049

[21] Appl. No.: 831,092

[22] Filed: Feb. 10, 1992

Related U.S. Application Data

[63] Continuation-in-part of Ser. No. 710,256, Jun. 4, 1991, abandoned, which is a continuation of Ser. No. 452,004, Dec. 18, 1989, abandoned.

[51] Int. Cl.$^5$ .............................. H01L 41/08
[52] U.S. Cl. .................... 310/338; 310/339; 200/181; 341/34
[58] Field of Search .................... 200/181; 341/34; 310/338, 339

[56] References Cited

U.S. PATENT DOCUMENTS

| 2,714,642 | 8/1955 | Kinsloy | 310/332 |
| 3,940,637 | 2/1976 | Ohigashi et al. | 310/339 |
| 4,158,117 | 6/1979 | Quilliam et al. | 310/329 |
| 4,398,074 | 8/1983 | Danielson | 200/517 |
| 4,527,105 | 7/1985 | Shiraishi | 310/339 |
| 4,542,325 | 9/1985 | Kobayashi | 310/339 |
| 4,580,074 | 4/1986 | Gilman | 310/339 |
| 4,598,181 | 7/1986 | Selby | 200/5 A |
| 4,703,139 | 10/1987 | Dunlap | 200/5 A |
| 4,868,566 | 9/1989 | Strobel | 310/339 |
| 4,896,069 | 1/1990 | Rosenberg | 310/339 |

FOREIGN PATENT DOCUMENTS

| 0001882 | 5/1979 | European Pat. Off. | 200/181 |
| 2805332 | 8/1978 | Fed. Rep. of Germany | 310/339 |
| 2718289 | 10/1978 | Fed. Rep. of Germany | 200/181 |
| 2754007 | 6/1979 | Fed. Rep. of Germany | 200/181 |
| 1188882 | 4/1970 | United Kingdom | 310/339 |

*Primary Examiner*—Steven L. Stephan
*Assistant Examiner*—Thomas M. Dougherty

[57] ABSTRACT

The first embodiment of a piezo electric transducer shown in this application has a housing, an actuator, piezoelectric material, a first fixed contact and a second fixed contact. The actuator overlies the piezo-electric material and is attached to the inner surface of the housing. The piezoelectric material overlies the spaced first and second fixed contacts whereby distortion of the piezoelectric material by the actuator causes a current to flow between the first and second fixed contacts. In the second embodiment the piezoelectric material is attached to the inner surface of the housing. In a variation of the first and second embodiments, the piezo electric material is sandwiched between first and second dome portions. The first dome portion is engaged to a first fixed contact and the second dome portion is engaged to a second fixed contact.

4 Claims, 6 Drawing Sheets

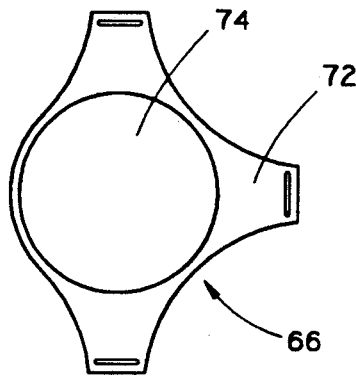  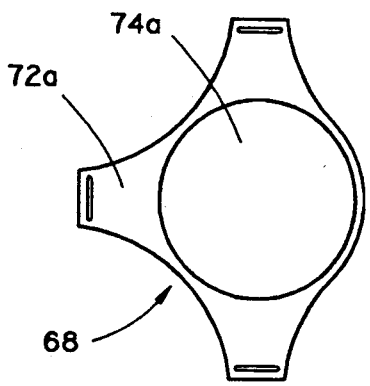
FIG. 9　　　　　FIG. 10　　　　　FIG. 11
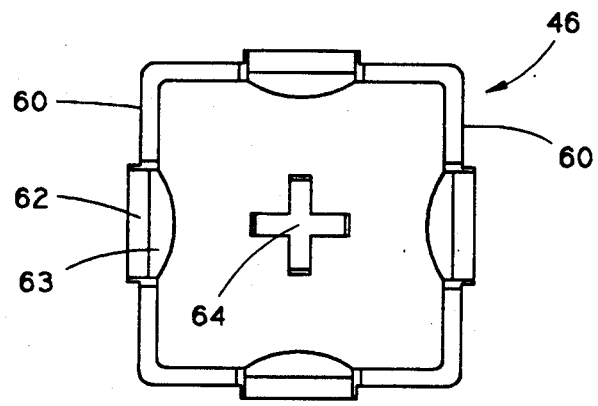
FIG. 12
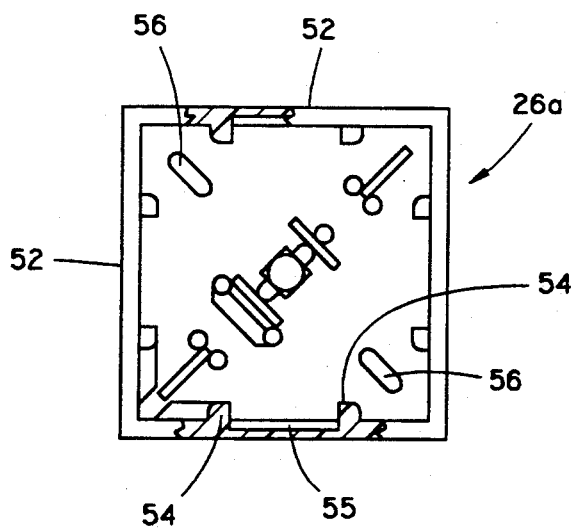
FIG. 13

PIEZO ELECTRIC TRANSDUCER

This is a continuation-in-part of co-pending application Ser. No. 07/710,256 filed on Jun. 4, 1991 now abandoned.

Which is a continuation of co-pending application Ser. No. 07/452,004 filed on Dec. 18, 1989 now abandoned.

BACKGROUND OF THE INVENTION

Field of the Invention

This invention relates to electrical switches and more specifically to a piezo electric switch. It also relates to a method of forming piezo electric switches.

SUMMARY OF THE INVENTION

The invention disclosed herein is first directed at a piezo electric transducer comprising an actuator, piezoelectric material, a first fixed contact and a second fixed contact. The actuator overlies the piezo electric material and the piezoelectric material overlies the spaced first and second fixed contacts whereby distortion of the piezoelectric material by the actuator causes a current to flow between the first and second fixed contacts. In a variation of the first and second embodiments the piezo electric material is sandwiched between first and second dome portions. The first dome portion is engaged to the first fixed contact and the second dome portion is engaged to a second fixed contact.

BRIEF DESCRIPTION OF THE DRAWINGS

Further details are explained below with the help of the example(s) illustrated in the attached drawings in which:

FIG. 9 is a bottom plan view of the housing of the piezo electric transducer shown in FIG. 4;.

FIG. 10 is a section of the piezo electric transducer showing the flexible arms 62 and their relation to the housing;

FIG. 11 is a perspective of the third variation of the piezo electric transducer showing the engaged relationship of the housing with the actuator;

FIG. 12 is a section of the third variation of the piezo electric transducer showing the printed circuit board including the lower surface thereof;

FIG. 13 is a section of the third variation of the piezo electric transducer showing the printed circuit board including the upper surface thereof.

DESCRIPTION OF THE PREFERRED EMBODIMENT(S)

Figure 1:
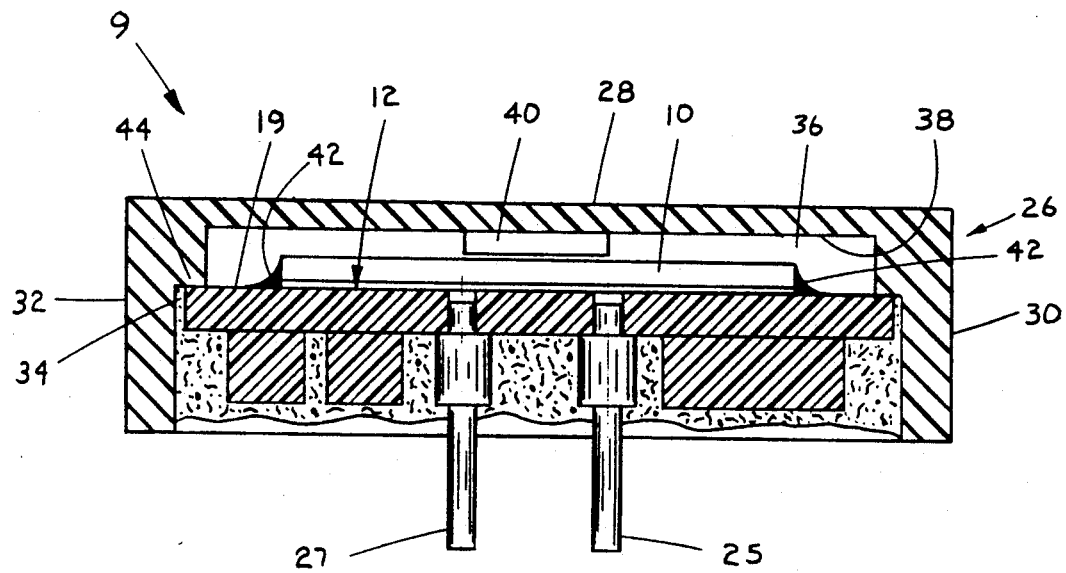
FIG. 1 is a sectional view of a piezo electric transducer with the actuator pad centrally attached to the inner surface of the top wall portion of the housing according to the present invention.

There is shown in the drawing a piezoelectric switch 9 including a piezoelectric pad 10 and a pcb assembly 12. The piezoelectric pad 10 is formed of any type of piezoelectric material for example, quartz or barium titanate. The piezoelectric material is potted, in a manner well known in the art to form the rectangular piezoelectric pad 10. The piezoelectric pad 10 could be circular if desired. The pcb assembly 12 which operates with the piezoelectric pad 10 comprises a first MOSFET transistor 14, second MOSFET transistor 16, external to the pcb assembly 12 is a load 18, a lamp, LED or keyboard for example and a printed circuit board 19. The diode 20 functions to clamp the output of the piezoelectric material so that it exceeds the input voltages on the first and second MOSFET transistors 14, 16 and protects them from spikes. The resistor 22 is a current limiting resistor to protect the first and second MOSFET transistors 14, 16. Basically the circuit is a diode voltage regulator with a load resistor 24. First and second fixed contacts 25, 27 formed from pins are positioned in the pcb assembly 12 and extend externally where they may be electrically engaged to the load 18. The pcb assembly 12 is completely potted to provide a rectangular configuration. The potting provides the printed circuit board 19 with a border space 34 which extends adjacent to the periphery of the printed circuit board 19. A housing 26 comprises a top wall portion 28 having four edges from one of the two opposed edges a first side wall 30 extends and from the other a second side wall 32 extends. The first side wall 30 is in spaced parallel relation with the second side wall 32 and the other edges also have walls extending in integral, right angle relation with the top wall portion 28 and with the first and second side walls 30, 32 to provide a cavity 36. The top wall portion 28 includes an inner surface 38 to which an actuator pad 40 is centrally attached. The actuator pad 40 is positioned in spaced, proximate relation to the piezoelectric pad 10. The piezoelectric pad 10 is positioned on the pcb assembly 12 through a series of supports 42 which hold the piezoelectric pad 10 in spaced, proximate parallel realtion to the pcb assembly 12. The top wall portion 28 is flexible. All the side walls including the first and second side walls 30, 32 are stepped to provide a circumferential shoulder 44. The border space 34 of the side walls including the first and second side walls 30, 32 is adhered or otherwise attached to the shoulder 44.

Figure 2:
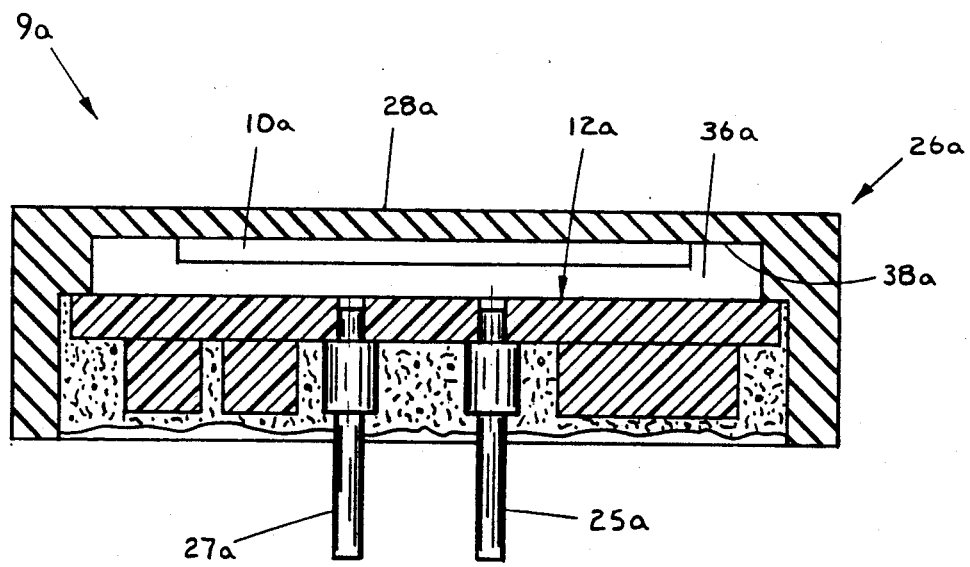
FIG. 2 is a sectional view of a variation of the piezo electric transducer shown in FIG. 1 with the piezoelectric pad centrally attached to the inner surface of the top wall portion of the housing according to the present invention.
Figure 3:
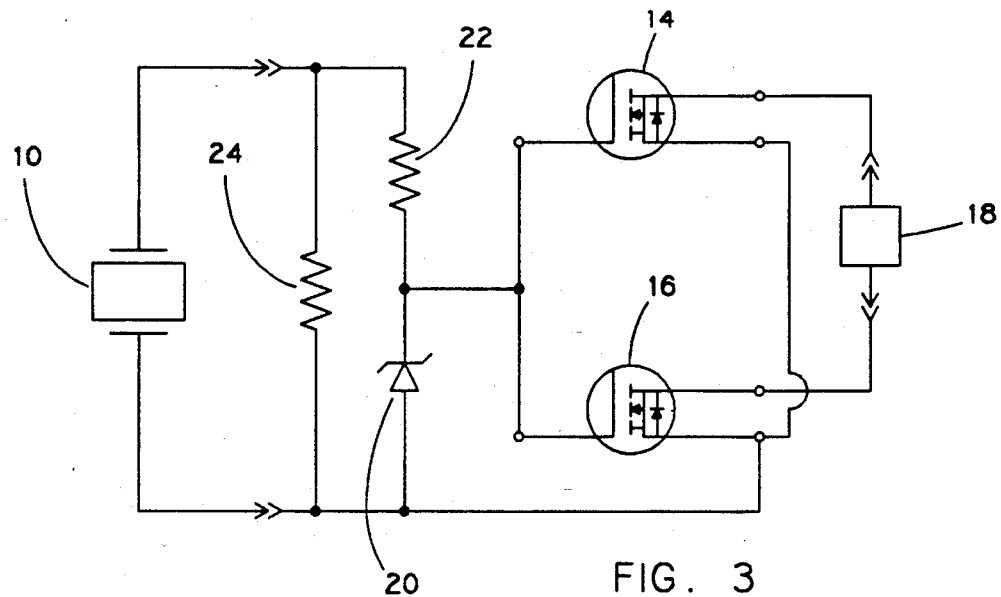
FIG. 3 is a schematic of the circuitry of the piezo electric transducer shown in FIG. 1.

There is shown at FIG. 2 a variation of the switch 9 as the switch 9a. The switch 9a is similar in most respects to the switch 9 including a piezoelectric pad 10, a housing 26 and a pcb assembly 12 shown as piezoelectric pad 10a, housing 26a and a pcb assembly 12a. The difference between the switch 9 and the switch 9a is that in the switch 9a the top wall portion 28a of the housing 26 includes an inner surface 38a to which the piezoelectric pad 10a is centrally attached. The piezoelectric pad 10a is positioned in spaced, proximate relation to the pcb assembly 12a which is mounted in the same way as the pcb assembly 12.

Figure 4:
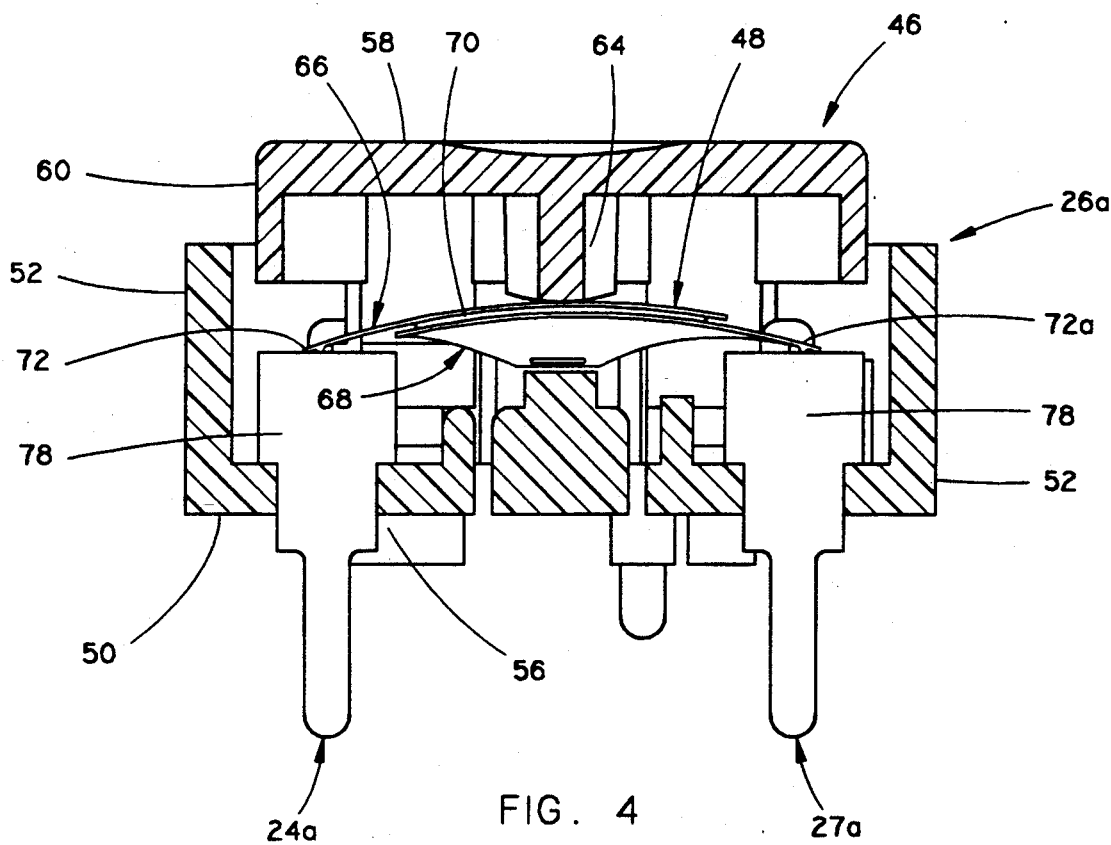
FIG. 4 is a sectional view of another variation of the piezo electric transducer shown in FIG. 1 with the piezoelectric material sandwiched between first and second dome portions according to the present invention.
Figure 5:
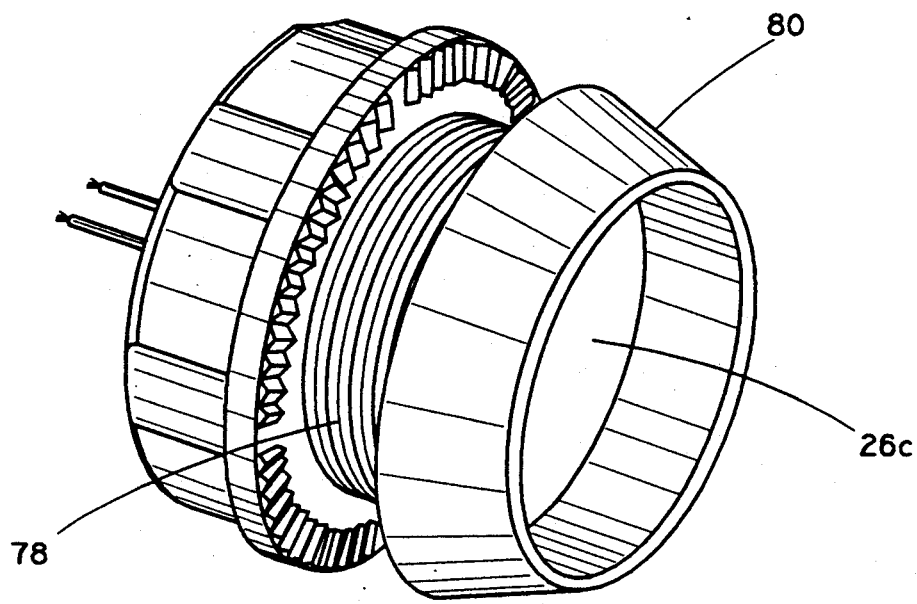
FIG. 5 is a top plan view of a first dome portion of the piezo electric transducer shown in FIG. 4.
Figure 6:
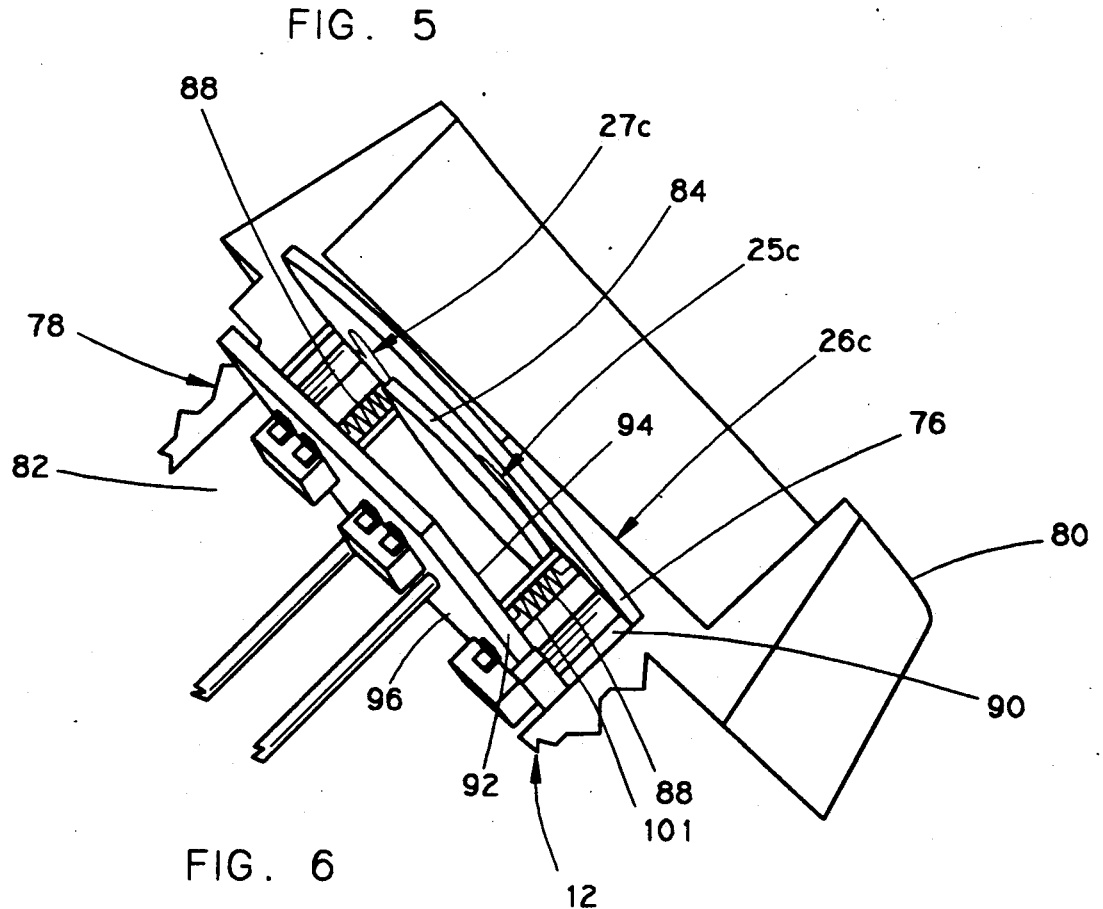
FIG. 6 is a side elevational view of the first dome portion shown in FIG. 5.
Figure 7:
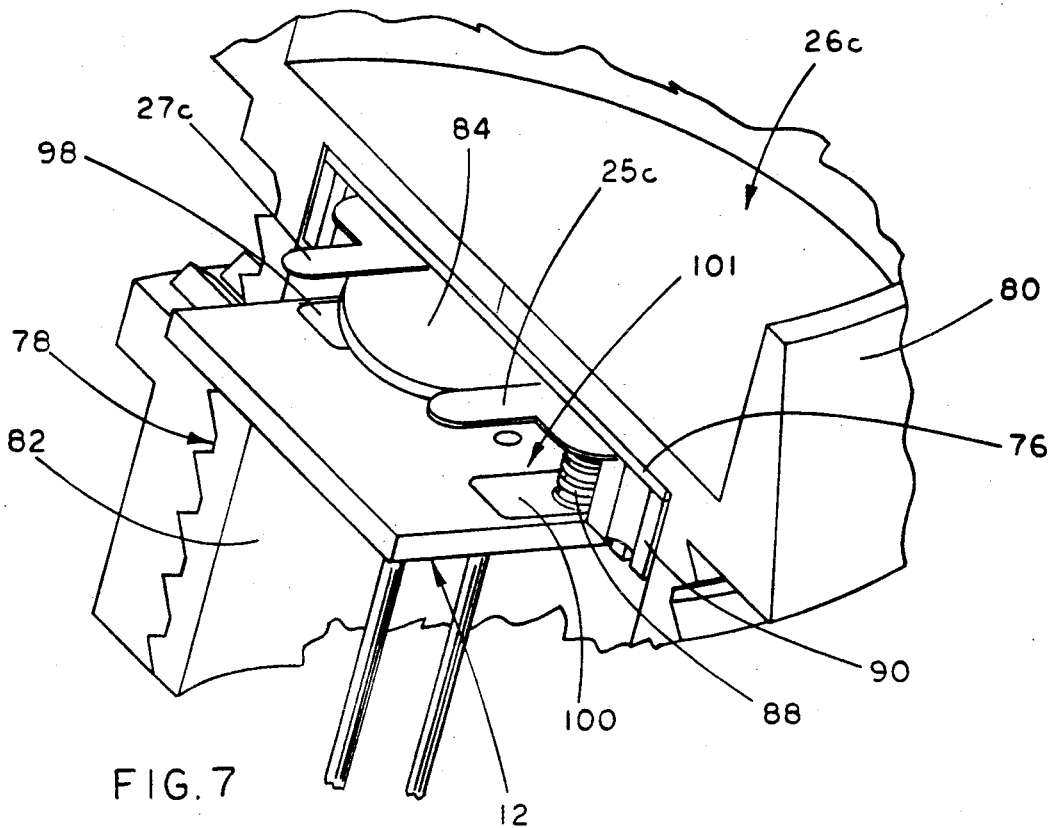
FIG. 7 is a top plan view of a second dome portion of the piezo electric transducer shown in FIG. 4.
Figure 8:
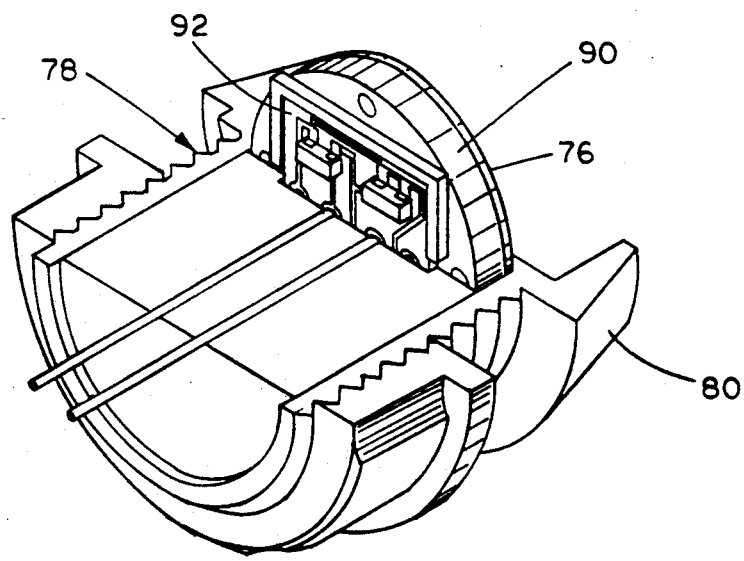
FIG. 8 is a bottom plan view of the actuator of the piezo electric transducer shown in FIG. 4.
Figure 14:
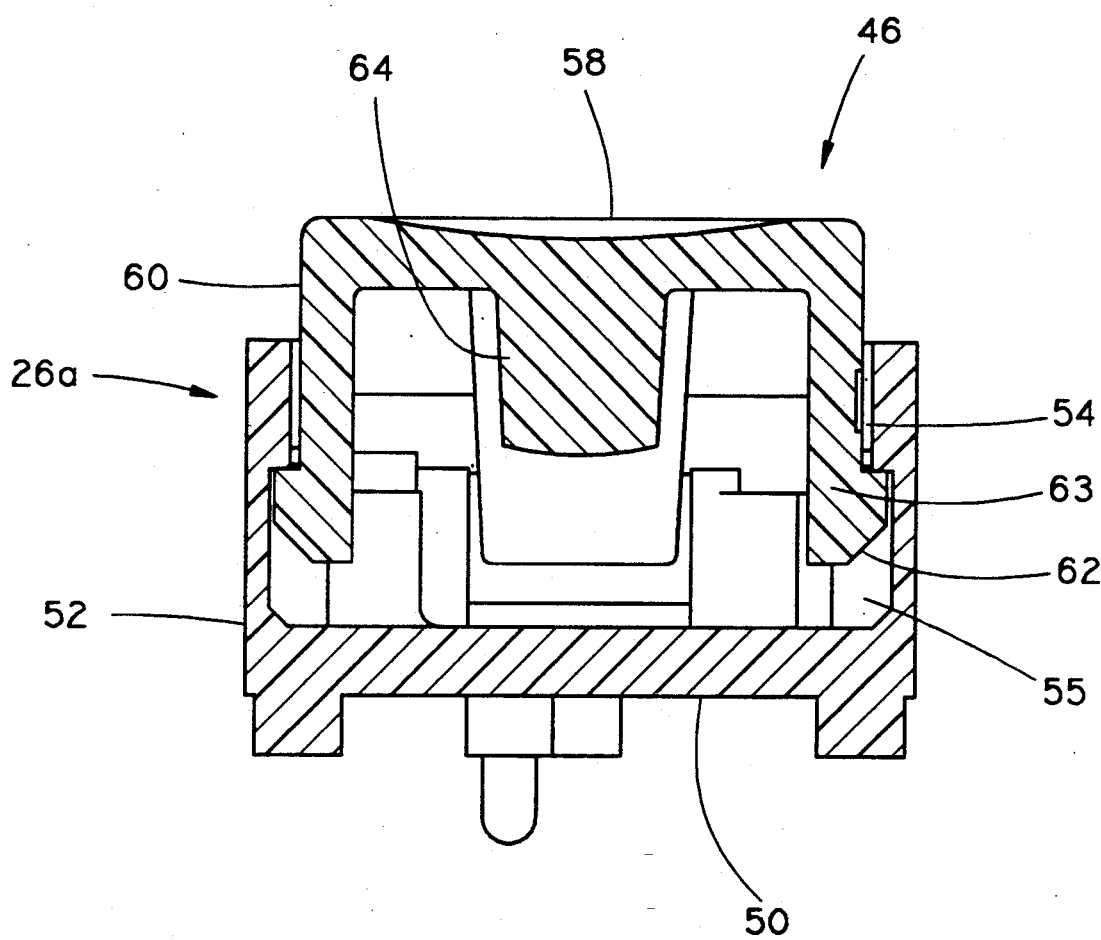
FIG. 14 is a section of the third variation of the piezo electric transducer showing the printed circuit board including the lower surface and the potted area thereof.

There is shown at FIG. 4 a second variation of the concept disclosed in switch 9. In this variation a voltage pulse transducer comprises a housing 26a, an actuator 46, a movable "contact" 48, a first fixed contact 24a and a second fixed contact 27a. The housing 26a includes a base portion 50 substantially rectangular in configuration. The base portion 50 has a wall 52 extending from each of the side edges to define a box like structure open at its top. The inner surface of each wall 52 includes a pair of spaced, parallel ribs 54 extending from the base portion 50 upwardly to proximate the top of each of the walls 52. A horizontal slot 55 is formed proximate the base portion 50 between the parallel ribs in right angle relation thereto on each of the walls 52. One of a pair of apertures 56 is formed through the base portion 50 at each of one pair of the diagonal corners.

The actuator 46 has a top portion 58 which is generally rectangular in configuration and which has side edges from each of which a barrier portion 60 extends to define a box like structure open at its top. A flexible arm 62 extends centrally from each of the barrier portions 60 and an actuator post 64 extends from the center of the inner surface of the base portion 50. The terminal end of each of the flexible arms 62 includes a shelf like shoulder portion 63.

The movable "contact" 48 comprises a first dome portion 66, a second dome portion 68 and a flexible, piezoelectric film 70. The piezoelectric film 70 is thin, planar and has a first and a second side. The first and second dome portions 66, 68 are silver plated and have the configuration of a manta ray fish. Each of the first and second dome portions 66, 68 includes an engagement finger 72, 72a respectifully and each of the engagement fingers 72, 72a has a free terminal end. The first and second dome portions 66, 68 also include circular shallow dished portions 74, 74a. The piezoelectric film 70 is adhered to the bottom surface of the first dome portion 66 except its dished portion 74 and the top surface of the second dome portion 68 except its dished portion 74. The adhesive is applied so that it forms an electrically insulating barrier between the two dome portions 66, 68.

The first fixed contact 24a is positioned in one of the apertures 56 of the base portion 50 by passing its terminal end therethrough to extend beyond the area defined by the housing 26a. The second fixed contact 27a is similarly positioned in the other aperture 56. The wider, integral contact section 78 of the fixed contacts 24a, 27a is positioned inside the cavity formed by the walls 52.

The voltage pulse transducer is assembled, after the sub assembly of the first and second dome portions 66, 68 and the piezoelectric film is formed, by positioning one of the engagement fingers 72 of the first dome portion 66 on the contact section 78 of the first fixed contact 24a and the other engagement finger 72 on the contact section 78 of the second fixed contact 27a. The actuator 46 is positioned by sliding the terminal ends of each of the terminal ends of each of the flexible arms 62 between a pair of ribs 54 until the respective shelf like shoulder portion 63 snaps into a slot 55 locking the actuator 46 to the housing 26a while holding the sub assembly of the first and second dome portions 66, 68 and the piezoelectric film 70 in "floating engagement" with the fixed contacts 76 due to the pressure of the actuator post 64 on the upper surface of the dished portion 74 of the first dome portion 66. If desired the engagement fingers 72 could be made integral with the contact sections of the fixed contacts 24a, 27a.

To operate the voltage pulse transducer manual pressure is applied to the top portion 58 of the actuator 46 forcing the subassembly of the first and second dome portions 66, 68 and the piezoelectric film 70 to flex, mechanically distorting the piezoelectric film 70 creating, for example a positive pulse which on release of manual pressure will again distort the film 70 causing a negative pulse. The polarity of the pulse being determined by the make up of the piezoelectric film 70. The voltage pulse transducer may be used to activate a micro processor for example.

There is shown in the drawings at FIGS. 11-14 a third variation 9c of the piezoelectric switch 9 including a piezoelectric material 10c, a housing 26c, First and second fixed contacts 25c, 27c, a fixed contact support or first pcb assembly 76 and a pcb assembly 12. The piezoelectric pad 10c is formed of any type of piezoelectric material for example, quartz or barium titanate.

The housing 26c is generally tubular in configuration comprises a cap portion which has a base 78 from the peripheral edge of which a first wall 80 extends upwardly defining a cup shape with the base 78. The housing 26c may be of a square configuration, for example, or of any acceptable configuration. The external surface of the first wall 80 is slanted. From the opposite side of the base 78, a tubular housing portion 82 extends. Both the first wall 80 and the housing portion 82 are in integral right angle relation with the base 78 and all three parts 78, 80, 82 are formed of an insulating plastic. The base 78 is formed so as to be flexible on the vertical axis of the housing 26c.

The fixed contact support 76 includes a wafer like bearing portion 84, generally circular in configuration formed of an insulating material and having the first and second fixed contacts 25c, 27c mounted on its lower surface by an adhesive or other electrically and mechanically acceptable means. The first and second fixed contacts 25c, 27c are in spaced parallel relationship and each of them includes a side extension 86.

The piezo electric material 10c is adhered to the lower surface of the fixed contact support 76 bridging the first and second fixed contacts 25c, 27c. An electrically conductive spring 88 is mounted on each of the first and second fixed contacts 25c, 27c extending away from the fixed contact support 76. The PCB assembly 12 comprises a PCB 92 and a PCM frame 90. The printed circuit board 92 including an upper surface 94 and a lower surface 96 is mounted in a printed circuit board frame or retainer 90. The printed circuit board frame 90 includes a rectangular opening defined by four sides. The four sides include a first side and a second side which are in spaced parallel relation with each other. A first pad 98 and a second pad 100 are mounted on the upper surface 94 of the printed circuit board 92. The first and second sides of the printed circuit board frame 90 each includes a through aperture 101 which overly a portion of the respective first and second pads 98, 100. The first and second pads 98, 100 are in spaced parallel relationship with each other and are electrically connected with the electrical components mounted on the lower surface 96 of the printed circuit board 92. The free end of one of the springs 88 is abutted against the first fixed contact 25c and the free end of the other spring 88 is butted the second fixed contacts 27c. The other end of one of the springs 88 is passed through an aperture 101 to bear against the, for example, first pad 98 and the other free end of the other spring 88 is passed through an other aperture 101 to bear against the second pad 100. The springs 88 serve only to act as electrical connections. They do not serve a mechanical function and they avoid the necessity of making electrical connections using small current carrying wires. Two long wires (electrical conductors) extend from printed circuitry formed on the lower surface 96 of the printed circuit board 92. A potting compound then is used to fill the remaining area of the housing portion 82 with the ends of the two long wires extending beyond the housing portion 82 to be connected to other electrical circuitry. The piezoelectric switch 9c is a sealed switch which may be utilized in vending machines, car wash applications, gas pumps etc.

What I claim is:

1. A piezoelectric transducer comprising an actuator, piezoelectric material, a housing, a movable contact, a first fixed contact and a second fixed contact, the housing having a top wall portion an inner surface, and a base portion, the base portion having first and second side edges, each of the side edges having a wall extending therefrom, each wall having a pair of spaced parallel ribs, a slot formed proximate the base portion between each pair of ribs, the actuator has a pair of barrier portions from which a flexible arm extends, the inner surface of the top wall portion completely overlying actuator, the actuator overlying the piezo electric material and the piezoelectric material overlying the spaced first and second fixed contacts, the housing defining a cavity, the first and second contacts positioned in the cavity, the movable contact including a first dome portion and a second dome portion, the piezoelectric material sandwiched between and engaged to the first and second dome portions, the first dome portion engaged to the first fixed contact and the second dome portion engaged to the second fixed contact, one of the flexible arms of the actuator engaged with one of the slots formed proximate the base portion while the actuator bearing against the first dome portion whereby distortion of the piezoelectric material by the actuator causes a current to flow between the first and second fixed contacts.

2. A piezoelectric transducer comprising a unitary housing, an actuator, piezoelectric material, a first fixed contact and a second fixed contact, a first electrically conductive spring mounted on the first fixed contact 25c and a second electrically conductive spring mounted on the second fixed contact, each of the springs having free ends, and a printed circuit board frame, frame, printed circuit board frame having a pair of through apertures, the housing having a top wall portion and an inner surface, the inner surface of the top wall portion completely overlying the actuator, the actuator attached to the piezo electric material and the piezoelectric material overlying the spaced first and second fixed contacts, the piezoelectric material having edges, the edges fixed in position whereby distortion of the piezoelectric material by the actuator causes a current to flow between the first and second fixed contacts, the free end of one of the springs abutted against the first fixed contact and the free end of the other spring butted the second fixed contact, the other end of one of the springs passed through one of the apertures of the printed circuit board frame and the other free end of the other spring passed through the other aperture of the printed circuit board frame.

3. A piezoelectric switch including piezoelectric material, a housing, first and second fixed contacts, a fixed contact support, two electrical conductors and a printed circuit board assembly, the housing having a flexible base, the base having a lower surface, the fixed contact support having an under surface, the first and second fixed contacts mounted on the under surface, the first and second fixed contacts in spaced relationship to each other, the piezo electric material attached to the under surface of the fixed contact support bridging the first and second fixed contacts, an electrically conductive spring mounted on each of the first and second fixed contacts extending away from the fixed contact support and the base and bracketing the piezo electric material, the printed circuit board assembly including a primary surface and a secondary surface, the printed circuit board assembly having first and second contact pads mounted thereon, the printed circuit board assembly includes an aperture formed on each side of the printed circuit board assembly a portion of the respective first and second pads, the first and second pads are in spaced relationship with each other and are electrically connected with the electrical components mounted on the secondary surface of the printed circuit board assembly, each of the springs has a terminal end and a free terminal end, the terminal end of one of the springs bears against the first fixed contact and the terminal end of the other spring bears against the second fixed contact, the free terminal end of one of the springs is passed through one of the through apertures to bear against the first pad and the free terminal end of the other spring being passed through the other aperture to bear against the second pad, printed circuitry being formed on the secondary surface of the printed circuit board assembly, the two electrical conductors electrically connected to and extending from the printed circuitry formed on the secondary surface of the printed circuit board.

4. A piezoelectric switch as set forth in claim 3 wherein a housing portion extends from the lower surface of the base, each of the two conductors having ends, and a potting compound substantially fills the housing portion circumscribing the two conductors with the ends of the two conductors extending beyond the housing portion.

* * * * *